United States Patent
Jeong et al.

(10) Patent No.: US 7,435,654 B2
(45) Date of Patent: Oct. 14, 2008

(54) ANALOG CAPACITOR HAVING AT LEAST THREE HIGH-K DIELECTRIC LAYERS, AND METHOD OF FABRICATING THE SAME

(75) Inventors: Yong-Kuk Jeong, Seoul (KR); Seok-Jun Won, Seoul (KR); Dae-Jin Kwon, Seoul (KR); Weon-Hong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 1 day.

(21) Appl. No.: 11/452,828

(22) Filed: Jun. 14, 2006

(65) Prior Publication Data

US 2006/0234466 A1    Oct. 19, 2006

Related U.S. Application Data

(62) Division of application No. 10/874,461, filed on Jun. 23, 2004, now Pat. No. 7,091,548.

(30) Foreign Application Priority Data

Sep. 19, 2003    (KR)    .................................... 03-65272

(51) Int. Cl.
*H01L 21/20* (2006.01)
*H01L 21/44* (2006.01)

(52) U.S. Cl. ........................ 438/287; 438/296; 438/381; 438/396; 438/697; 438/785; 257/E21.008; 257/E21.207; 257/E21.209; 257/E21.682

(58) Field of Classification Search ............... 438/381, 438/287, 296, 396, 697, 785
See application file for complete search history.

(56) References Cited

U.S. PATENT DOCUMENTS

| | | | |
|---|---|---|---|
| 5,614,018 A | 3/1997 | Azuma et al. | 117/68 |
| 5,688,724 A | 11/1997 | Yoon et al. | 437/235 |
| 6,153,898 A | 11/2000 | Watanabe et al. | 257/295 |
| 6,159,819 A * | 12/2000 | Tsai et al. | 438/394 |

(Continued)

FOREIGN PATENT DOCUMENTS

JP    2000-031387    1/2000

(Continued)

*Primary Examiner*—Michael S Lebentritt
(74) *Attorney, Agent, or Firm*—Mills & Onello LLP

(57) ABSTRACT

There are provided an analog capacitor having at least three high-k dielectric layers, and a method of fabricating the same. The analog capacitor includes a lower electrode, an upper electrode, and at least three high-k dielectric layers interposed between the lower electrode and the upper electrode. The at least three high-k dielectric layers include a bottom dielectric layer contacting the lower electrode, a top dielectric layer contacting the upper electrode, and a middle dielectric layer interposed between the bottom dielectric layer and the top dielectric layer. Further, each of the bottom dielectric layer and the top dielectric layer is a high-k dielectric layer, the absolute value of the quadratic coefficient of VCC thereof being relatively low compared to that of the middle dielectric layer, and the middle dielectric layer is a high-k dielectric layer having a low leakage current compared to those of the bottom dielectric layer and the top dielectric layer. Therefore, with use of the at least three high-k dielectric layers, the VCC characteristics and the leakage current characteristics of the analog capacitor can be optimized.

18 Claims, 9 Drawing Sheets

U.S. PATENT DOCUMENTS

| | | | |
|---|---|---|---|
| 6,320,244 B1 | 11/2001 | Alers et al. | 257/534 |
| 6,341,056 B1 | 1/2002 | Allman et al. | 361/312 |
| 6,407,435 B1 | 6/2002 | Ma et al. | 257/411 |
| 6,495,878 B1 | 12/2002 | Hayashi et al. | 257/310 |
| 6,660,660 B2 | 12/2003 | Haukka et al. | 438/778 |
| 6,803,641 B2 * | 10/2004 | Rao et al. | 257/532 |
| 6,849,925 B1 | 2/2005 | Halliyal et al. | 257/635 |
| 6,885,056 B1 | 4/2005 | Dornisch et al. | 257/310 |
| 6,911,402 B2 | 6/2005 | Lee et al. | 438/763 |
| 2002/0106536 A1 | 8/2002 | Lee et al. | 428/702 |
| 2002/0153579 A1 | 10/2002 | Yamamoto | 257/412 |
| 2003/0096473 A1 | 5/2003 | Shih et al. | 438/240 |
| 2004/0104420 A1 | 6/2004 | Coolbaugh et al. | 257/310 |
| 2004/0113235 A1 | 6/2004 | Coolbaugh et al. | 257/532 |

FOREIGN PATENT DOCUMENTS

| | | |
|---|---|---|
| KR | 10-2000-0007802 | 2/2000 |
| KR | 10-2000-0041370 | 7/2000 |
| KR | 10-2001-0021015 | 3/2001 |
| KR | 2003-0040530 | 5/2003 |
| WO | WO 02/31875 | 4/2002 |

* cited by examiner

ANALOG CAPACITOR HAVING AT LEAST THREE HIGH-K DIELECTRIC LAYERS, AND METHOD OF FABRICATING THE SAME

CROSS-REFERENCE TO RELATED APPLICATION

This application is a divisional application of U.S. Ser. No. 10/874,461, filed Jun. 23, 2004, now U.S. Pat. No. 7,091,548 which relies for priority upon Korean Patent Application No. 2003-65272, filed on Sep. 19, 2003, the contents of which are hereby incorporated herein by reference in their entirety.

BACKGROUND OF THE INVENTION

1. Field of the Invention

The present invention relates to an analog capacitor, and a method of fabricating the same, and more particularly, to an analog capacitor having at least three high-k dielectric layers, and a method of fabricating the same.

2. Description of the Related Art

An analog capacitor is one element of a device typically used in an analog-to-digital converter (ADC), a RF device, a switching capacitor filter, a CMOS image sensor (CIS), and the like. The analog capacitor is a capacitor which obtains bits and operates based on the fact that the quantity of charge stored in the electrodes on both ends of a dielectric layer varies corresponding to the change of an applied voltage.

When a voltage (V) is applied on a capacitor, the quantity of charge (Q) stored in the electrodes of both ends of a dielectric layer can be given by Equation 1.

$$Q = C \times V,\qquad \text{[Equation 1]}$$

where C is a capacitance of the capacitor.

In the case in which the capacitance (C) has a constant value, the quantity of charge (Q) is linearly increased in proportion to the voltage (V). The quantity of charge (Q) stored in the capacitor is constant, when the voltage (V) is fixed. Therefore, the voltage can be divided within the range of an operating voltage of a capacitor, and the quantity of charge corresponding to each divided voltage can be used as one bit.

In order to obtain high bits in an analog capacitor, the difference of the quantities of charge corresponding to each divided voltage should be large and constant. For this purpose, the dielectric layer used in an analog capacitor requires that its voltage coefficient of capacitance (VCC), i.e., the change of the capacitance in variance with voltage, be low, its capacitance be large, and its leakage current be low.

With the increased integration in semiconductor devices, the capacitor size is increasingly scaled down. Therefore, in order to prevent the reduction of the capacitance corresponding to the size decrease of the capacitor, a high-k dielectric layer is used. A dielectric layer having a dielectric constant higher than or equal to 8 is defined as a high-k dielectric layer.

The capacitance of a dielectric layer typically depends on a voltage. That is, capacitance ((C(V)) can be indicated by a function of applied voltage (V), and can be fitted as a quadratic function, which is given by Equation 2.

$$C(V) = C(0) \times (a \times V^2 + b \times V + 1)\qquad \text{[Equation 2]}$$

where C(0) is a capacitance of a capacitor with applied voltage 0V, a is a quadratic coefficient of VCC, and b is a linear coefficient of VCC. Thus, in order to have a low value of VCC, a and b should be close to zero.

The quadratic coefficient a is known to be related to the interfacial characteristics of the electrodes and the dielectric layer of the capacitor. That is, if a depletion occurs in the electrodes when a voltage is applied, the quadratic coefficient has a negative value. In contrast, if electrons penetrate into the dielectric layer thereby to reduce the effective thickness of the dielectric layer, the quadratic coefficient has a positive value.

Therefore, the dielectric layer used in the analog capacitor as a high-k dielectric layer requires that its leakage current be low and that the absolute value of the quadratic coefficient of VCC be low. However, it is difficult to satisfy the leakage current characteristics and the VCC characteristics simultaneously using a single dielectric layer.

SUMMARY OF THE INVENTION

Exemplary embodiments of the present invention provide an analog capacitor with a high-k dielectric layer, being capable of optimizing the leakage current characteristics and the VCC characteristics, and a method of fabricating the analog capacitor.

In accordance with one aspect, the present invention provides an analog capacitor. The analog capacitor includes a lower electrode, an upper electrode facing the lower electrode, and at least three high-k dielectric layers interposed between the lower electrode and the upper electrode. The at least three high-k dielectric layers include a bottom dielectric layer contacting the lower electrode, a top dielectric layer contacting the upper electrode, and a middle dielectric layer interposed between the bottom dielectric layer and the top dielectric layer. Further, each of the bottom dielectric layer and the top dielectric layer is a high-k dielectric layer having a relatively low absolute value of the quadratic coefficient of VCC thereof compared to that of the middle dielectric layer, and the middle dielectric layer is a high-k dielectric layer having a relatively low leakage current compared to those of the bottom dielectric layer and the top dielectric layer.

The high-k dielectric layers having a low absolute value of the quadratic coefficient of VCC contact the electrodes, and the high-k dielectric layer having a low leakage current is interposed between the electrodes. Therefore, the VCC characteristics and the leakage current characteristics can be optimized.

In one embodiment, the bottom dielectric layer and the top dielectric layer are layers of different materials. Each of the bottom dielectric layer and the top dielectric layer can be a material layer selected from the group consisting of $Ta_2O_5$, Ti-doped $Ta_2O_5$, Nb-doped $Ta_2O_5$, BST, PZT and $TiO_2$ layers. The middle dielectric layer having a relatively low leakage current can be a material layer selected from the group consisting of $Al_2O_3$, $HfO_2$, $ZrO_2$ and $La_2O_3$ layers. The analog capacitor can further include: a buffer dielectric layer interposed between the bottom dielectric layer and the middle dielectric layer; and another buffer dielectric layer interposed between the middle dielectric layer and the top dielectric layer.

In one embodiment, one dielectric layer of the bottom dielectric layer and the top dielectric layer is a $Ta_2O_5$ layer. The other dielectric layer of the bottom dielectric layer and the top dielectric layer can be a high-k dielectric layer selected from the group consisting of BST, PZT and $TiO_2$ layers. In one embodiment, the middle dielectric layer having a relatively low leakage current is a high-k dielectric layer selected from the group consisting of $Al_2O_3$, $HfO_2$, $ZrO_2$ and $La_2O_3$ layers. The analog capacitor can further include: a buffer dielectric layer interposed between the bottom dielectric layer and the middle dielectric layer; and another buffer dielectric layer interposed between the middle dielectric layer and the top dielectric layer.

In one embodiment, the bottom dielectric layer and the top dielectric layer are the same material. The same material layer is a $Ta_2O_5$ layer. The middle dielectric layer having a relatively low leakage current can be a high-k dielectric layer selected from the group consisting of $Al_2O_3$, $HfO_2$, $ZrO_2$ and $La_2O_3$ layers. In one embodiment, the middle dielectric layer having a relatively low leakage current is an $Al_2O_3$ or $HfO_2$ layer. The analog capacitor can further include: a buffer dielectric layer interposed between the bottom dielectric layer and the middle dielectric layer; and another buffer dielectric layer interposed between the middle dielectric layer and the top dielectric layer.

In accordance with another aspect, the invention is directed to an analog capacitor comprising: a lower electrode; an upper electrode facing the lower electrode; a bottom dielectric layer interposed between the lower electrode and the upper electrode to be in contact with the lower electrode, and formed of a $Ta_2O_5$ layer; a top dielectric layer interposed between the lower electrode and the upper electrode to be in contact with the upper electrode, and formed of a $Ta_2O_5$ layer; and a middle dielectric layer interposed between the bottom dielectric layer and the top dielectric layer, and formed of an $Al_2O_3$ layer.

In one embodiment, the analog capacitor further includes: a buffer dielectric layer interposed between the bottom dielectric layer and the middle dielectric layer; and another buffer dielectric layer interposed between the middle dielectric layer and the top dielectric layer.

In accordance with another aspect, the invention is directed to an analog capacitor comprising: a lower electrode; an upper electrode facing the lower electrode; a bottom dielectric layer interposed between the lower electrode and the upper electrode to be in contact with the lower electrode, and formed of a $Ta_2O_5$ layer; a top dielectric layer interposed between the lower electrode and the upper electrode to be in contact with the upper electrode, and formed of a $Ta_2O_5$ layer; and a middle dielectric layer interposed between the bottom dielectric layer and the top dielectric layer, and formed of a $HfO_2$ layer.

In one embodiment, the analog capacitor further includes: a buffer dielectric layer interposed between the bottom dielectric layer and the middle dielectric layer; and another buffer dielectric layer interposed between the middle dielectric layer and the top dielectric layer.

In accordance with another aspect, the present invention provides a method of fabricating an analog capacitor. The method includes forming a lower insulating layer on a semiconductor substrate. A lower electrode layer is formed on the lower insulating layer. At least three high-k dielectric layers are sequentially formed on the semiconductor substrate having the lower electrode layer. The at least three high-k dielectric layers include a bottom dielectric layer, a middle dielectric layer, and a top dielectric layer. Each of the bottom dielectric layer and the top dielectric layer is a high-k dielectric layer having a relatively low absolute value of the quadratic coefficient of VCC thereof compared to that of the middle dielectric layer, and the middle dielectric layer is a high-k dielectric layer having a relatively low leakage current compared to those of the bottom dielectric layer and the top dielectric layer. An upper electrode layer is formed on the at least three high-k dielectric layers to be in contact with the top dielectric layer.

In one embodiment, the top dielectric layer is formed of a different material layer from the bottom dielectric layer. In one embodiment, each of the bottom dielectric layer and the top dielectric layer is a material layer selected from the group consisting of $Ta_2O_5$, Ti-doped $Ta_2O_5$, Nb-doped $Ta_2O_5$, BST, PZT and $TiO_2$ layers. The middle dielectric layer having a relatively low leakage current can be a material layer selected from the group consisting of $Al_2O_3$, $HfO_2$, $ZrO_2$ and $La_2O_3$ layers. In one embodiment, the method further includes: forming a buffer dielectric layer prior to formation of the middle dielectric layer; and forming another buffer dielectric layer prior to formation of the top dielectric layer. Each of the bottom dielectric layer, the middle dielectric layer, and the top dielectric layer can be formed using CVD method or ALD method. Each of the dielectric layers formed using CVD method or ALD method can be formed at a temperature range of 200° C. to 500° C. In one embodiment, the method further includes: annealing the dielectric layers formed using the CVD method in a gas atmosphere containing oxygen. In one embodiment, the gas atmosphere containing oxygen is an atmosphere containing at least one gas selected from the group consisting of $O_3$, $O_2$-Plasma and $N_2O$-plasma gases. One dielectric layer of the bottom dielectric layer and the top dielectric layer can be a $Ta_2O_5$ layer. The other dielectric layer of the bottom dielectric layer and the top dielectric layer can be a high-k dielectric layer selected from the group consisting of BST, PZT and $TiO_2$ layers. The middle dielectric layer having a relatively low leakage current can be a high-k dielectric layer selected from the group consisting of $Al_2O_3$, $HfO_2$, $ZrO_2$, and $La_2O_3$ layers.

The method can further include: forming a buffer dielectric layer prior to formation of the middle dielectric layer; and forming another buffer dielectric layer prior to formation of the top dielectric layer. Each of the bottom dielectric layer, the middle dielectric layer, and the top dielectric layer can be formed using CVD method or ALD method. Each of the dielectric layers formed using CVD method or ALD method can be formed at a temperature range of 200° C. to 500° C.

In one embodiment, the top dielectric layer is formed of a same material layer as the bottom dielectric layer. The same material layer can be a $Ta_2O_5$ layer. In one embodiment, the middle dielectric layer having a relatively low leakage current is a high-k dielectric layer selected from the group consisting of $Al_2O_3$, $HfO_2$, $ZrO_2$ and $La_2O_3$ layers. The middle dielectric layer having a relatively low leakage current is an $Al_2O_3$ or $HfO_2$ layer. The method can further include: forming a buffer dielectric layer prior to formation of the middle dielectric layer; and forming another buffer dielectric layer prior to formation of the top dielectric layer. Each of the bottom dielectric layer, the middle dielectric layer, and the top dielectric layer is formed using CVD method or ALD method. The method can further include: annealing the dielectric layers formed by the CVD method in a gas atmosphere containing oxygen.

In an exemplary embodiment of the present invention, before forming at least three high-k dielectric layers, the lower electrode layer is patterned to form a lower electrode. Further, an interlayer insulating layer is formed on the semiconductor substrate having the lower electrode, and the interlayer insulating layer is patterned to form a contact hole exposing the lower electrode. Further, the at least three high-k dielectric layers are conformally formed on the semiconductor substrate having the contact hole, and the upper electrode layer is formed to fill the contact hole.

In one embodiment of the present invention, the upper electrode layer is patterned using photolithography and etch processes to form an upper electrode. Then, the at least three high-k dielectric layers and the lower electrode layer are patterned through photolithography and etch processes to form a lower electrode. Herein, the lower electrode is greater in width than the upper electrode. Since the upper electrode and the lower electrode are formed by discrete etch processes, electrical shorts between the electrodes can be prevented.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

In the drawings, the thickness of layers and regions are exaggerated for clarity.

DETAILED DESCRIPTION OF THE INVENTION

In order to overcome the limitation of a capacitor having one dielectric layer, a capacitor having multiple dielectric layers and a method of fabricating the same are disclosed in U.S. Pat. No. 6,341,056, entitled, "Capacitor with multiple-component dielectric and method of fabricating same," to Allman et. al.

The capacitor disclosed in U.S. Pat. No. 6,341,056 has dielectric layers, which have electric characteristic curves that curve in opposite directions with respect to one another, in order to improve the VCC characteristics. In order to prevent the leakage current with use of a high-k dielectric layer, a dielectric layer having a high leakage current is made to be placed in the middle layer, and dielectric layers having low leakage currents are made to be placed above and under the middle dielectric layer. Therefore, a high-k dielectric layer having a high leakage current can be used in the capacitor with leakage current prevented.

However, the capacitor disclosed in U.S. Pat. No. 6,341,056 may have a problem of little improvement in the VCC characteristics. That is, if the dielectric layer having a low leakage current shows bad VCC characteristics, the VCC characteristics of the capacitor are not improved.

As a result, there is required an analog capacitor with a high-k dielectric layer, being capable of optimizing the leakage current characteristics and the VCC characteristics.

Figure 1:
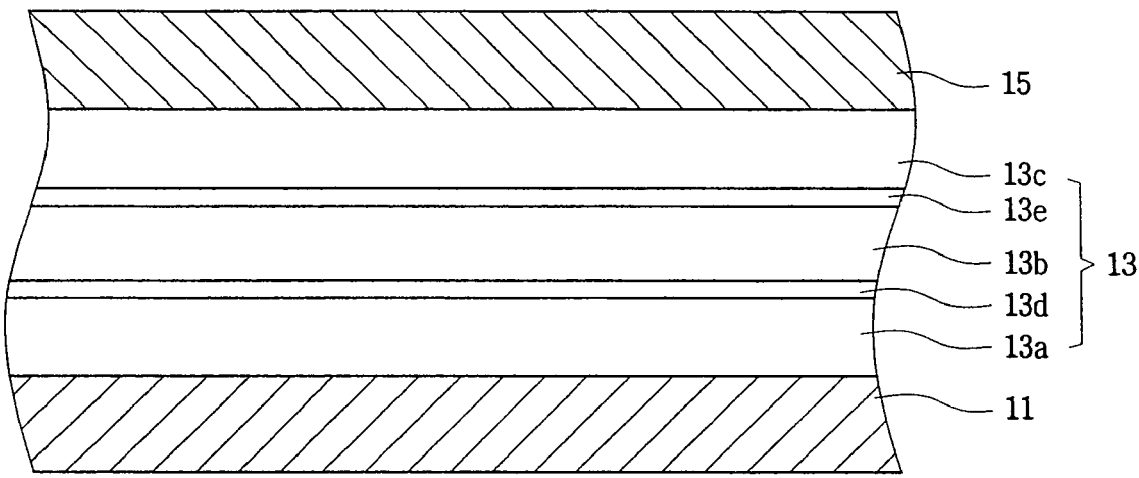
FIG. 1 is a sectional view illustrating an analog capacitor according to an embodiment of the present invention.

FIG. 1 is a sectional view illustrating an analog capacitor having at least three high-k dielectric layers according to an embodiment of the present invention.

Referring to FIG. 1, at least three high-k dielectric layers 13 are interposed between a lower electrode 11 and an upper electrode 15. Each of the lower electrode 11 and the upper electrode 15 is connected to lines to apply voltages to the capacitor or to allow electric charges to move.

Preferably, each of the lower electrode 11 and the upper electrode 15 is at least one conductive layer selected from the group consisting of titanium (Ti), titanium nitride (TiN), tantalum (Ta), tantalum nitride (TaN), aluminum (Al), copper (Cu), tungsten (W), tungsten nitride (WN), iridium (Ir), iridium oxide ($IrO_2$), ruthenium (Ru), and ruthenium oxide ($RuO_2$) layers. The lower electrode 11 and the upper electrode 15 are not required to be the same conductive layers.

At least three high-k dielectric layers 13 include a bottom dielectric layer 13a contacting the lower electrode 11, a top dielectric layer 13c contacting the upper electrode 15, and a middle dielectric layer 13b interposed between the bottom dielectric layer and the top dielectric layer.

The bottom dielectric layer 13a is a high-k dielectric layer having a relatively low absolute value of the quadratic coefficient of VCC compared to the middle dielectric layer 13b, that is, a high-k dielectric layer having good VCC characteristics.

The quadratic coefficients of VCC of the bottom dielectric layer 13a and the middle dielectric layer 13b can be compared as follows.

That is, there are provided a capacitor structured to include electrodes formed of the same material layer as the lower electrode 11, and a dielectric layer interposed between the electrodes and formed of the same layer as the bottom dielectric layer 13a, and a capacitor structured to include a dielectric layer interposed between the electrodes and formed of the same layer as the middle dielectric layer 13b. The capacitances of the capacitors with respect to voltages are measured. Then, as shown in Equation 2, the capacitances of each capacitor are fitted as a quadratic function with respect to voltages to determine the quadratic coefficient a of each capacitor. By comparing the quadratic coefficients of the capacitors, a dielectric layer having a good VCC characteristic can be selected.

In one embodiment, the bottom dielectric layer 13a, having a relatively low absolute value of the quadratic coefficient of VCC, is formed of at least one material layer selected from the group consisting of tantalum oxide ($Ta_2O_5$), titanium-doped tantalum oxide (Ti-doped $Ta_2O_5$), niobium-doped tantalum oxide (Nb-doped $Ta_2O_5$), barium strontium titanate (Ba—Sr—$TiO_3$; BST), lead zirconate titanate (Pb—Zr—$TiO_3$; PZT), and titanium oxide ($TiO_2$) layers, and more preferably, it is formed of a $Ta_2O_5$ layer.

Further, the top dielectric layer 13c is a high-k dielectric layer having a relatively low absolute value of the quadratic coefficient of VCC compared to the middle dielectric layer 13b. The quadratic coefficients of VCC of the top dielectric layer 13c and the middle dielectric layer 13b can be compared by using the electrodes formed of the same material layer as the upper electrode 15.

In one embodiment, the top dielectric layer 13c, having a relatively low absolute value of the quadratic coefficient of VCC, is formed of at least one material layer selected from the group consisting of tantalum oxide ($Ta_2O_5$), titanium-doped tantalum oxide (Ti-doped $Ta_2O_5$), niobium-doped tantalum oxide (Nb-doped $Ta_2O_5$), barium strontium titanate (Ba—Sr—$TiO_3$; BST), lead zirconate titanate (Pb—Zr—$TiO_3$; PZT), and titanium oxide ($TiO_2$) layers, and more preferably, it is formed of a $Ta_2O_5$ layer. The top dielectric layer 13c is not required to be the same material layer as the bottom dielectric layer 13a.

The bottom dielectric layer 13a and the top dielectric layer 13c, contacting the lower electrode 11 and the upper electrode 15, respectively, have good VCC characteristics compared to the middle dielectric layer 13b. Therefore, the VCC characteristics of the middle dielectric layer 13b can be improved employing the bottom dielectric layer 13a and the top dielectric layer 13c.

The middle dielectric layer 13b can be a dielectric layer having a relatively low leakage current compared to the bottom dielectric layer 13a and the top dielectric layer 13c.

In one embodiment, the middle dielectric layer 13b having a relatively low leakage current is a layer selected from the group consisting of alumina ($Al_2O_3$), hafnium oxide ($HfO_2$), zirconate ($ZrO_2$), and lanthanum oxide ($La_2O_3$) layers, and more preferably, it is alumina ($Al_2O_3$) or hafnium oxide ($HfO_2$) layer.

Generally, high-k dielectric layers, having good VCC characteristics, have bad leakage current characteristics. Therefore, the leakage current characteristics of a capacitor can be improved by interposing the high-k dielectric layer having a relatively low leakage current as above between the high-k dielectric layers having a good VCC characteristics.

A buffer dielectric layer 13d can be interposed between the bottom dielectric layer 13a and the middle dielectric layer 13b. The buffer dielectric layer 13d can be used in order to remove interfacial defects of the bottom dielectric layer 13a and the middle dielectric layer 13b. Further, another buffer dielectric layer 13e can be interposed between the middle dielectric layer 13b and the top dielectric layer 13c. The buffer dielectric layer 13e can be used in order to remove interfacial defects of the middle dielectric layer 13b and the top dielectric layer 13c.

As a result, the high-k dielectric layers having good VCC characteristics are allowed to contact the electrodes, and the layer having good leakage current characteristics is allowed to be interposed between the high-k dielectric layers, thereby optimizing the VCC characteristics and the leakage current characteristics.

FIGS. 2A to 2D are sectional views illustrating a method of fabricating an analog capacitor according to one embodiment of the present invention.

Figure 2A:
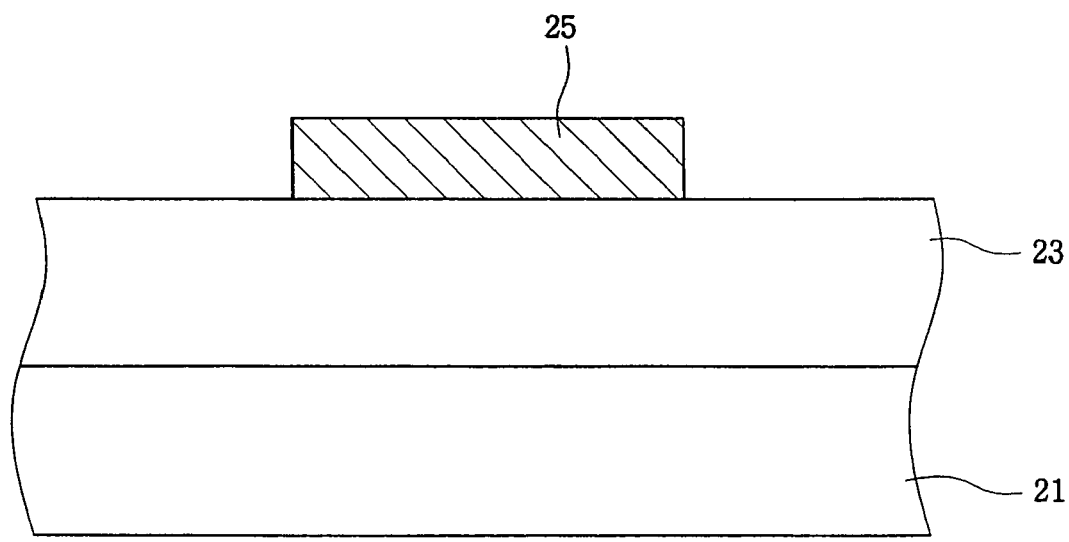
FIGS. 2A to 2D are sectional views illustrating a method of fabricating the analog capacitor of FIG. 1 according to an embodiment of the present invention.

Referring to FIG. 2A, a lower insulating layer 23 is formed on a semiconductor substrate 21. The semiconductor substrate 21 may have lines (not shown) formed thereon in advance. The lower insulating layer 23 can be formed of a silicon oxide layer, and is preferably formed of a low-k dielectric layer.

A lower electrode layer is formed on the semiconductor substrate having the lower insulating layer 23. The lower electrode layer is formed of at least one layer selected from the group consisting of Ti, TiN, Ta, TaN, Al, Cu, W, WN, Ir, $IrO_2$, Ru, and $RuO_2$ layers.

The lower electrode layer can be formed using a physical vapor deposition (PVD) method, a chemical vapor deposition (CVD) method, or an atomic layer deposition (ALD) method, and is preferably formed at a temperature range of 25° C. to 500° C.

The lower electrode layer is patterned using photolithography and etch processes to form a lower electrode 25. Herein, lower lines (not shown) can be formed along with the lower electrode 25. The lower electrode 25 can be connected to at least one of the lower lines.

Figure 2B:
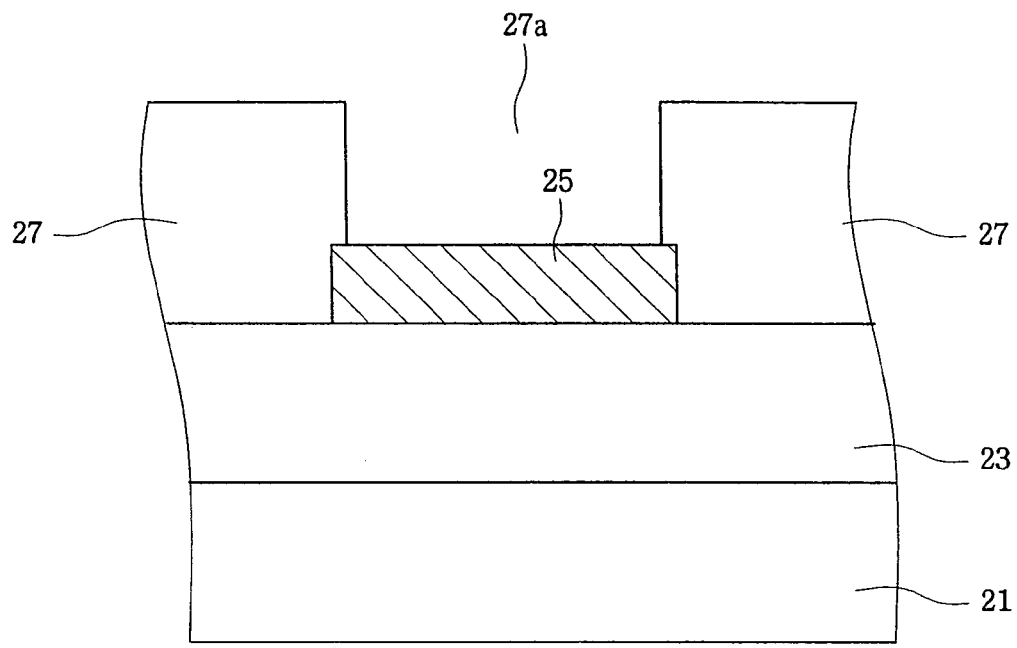

Referring to FIG. 2B, an interlayer insulating layer 27 is formed on the semiconductor substrate having the lower electrode 25. The interlayer insulating layer 27 can be formed of a silicon oxide layer or a low-k dielectric layer. The interlayer insulating layer 27 is patterned using photolithography and etch processes to form a contact hole 27a exposing the lower electrode 25.

Figure 2C:
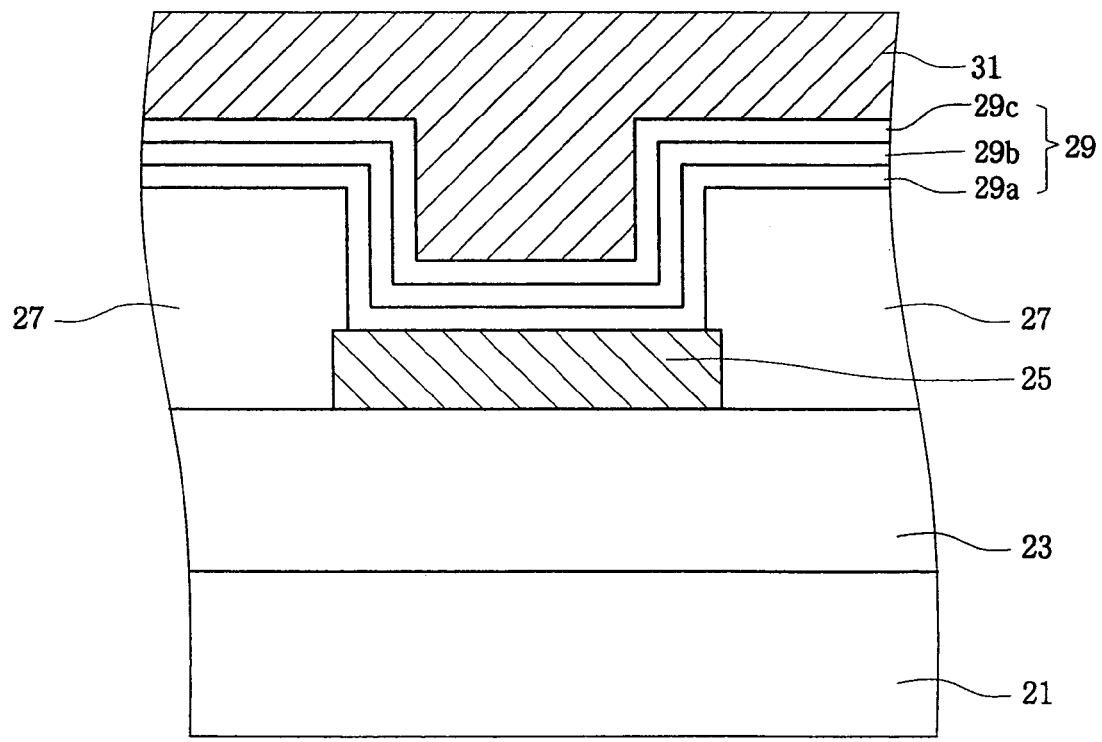

Referring to FIG. 2C, a bottom dielectric layer 29a, a middle dielectric layer 29b, and a top dielectric layer 29c are sequentially and conformally formed on the semiconductor substrate having the contact hole 27a. Before the middle dielectric layer 29b is formed, a buffer dielectric layer (not shown) can be further formed, and before the top dielectric layer 29c is formed, another buffer dielectric layer (not shown) can be further formed. The buffer dielectric layers can be used in order to prevent interfacial defects which may occur between the bottom dielectric layer 29a and the middle dielectric layer 29b, and interfacial defects which may occur between the middle dielectric layer 29b and the top dielectric layer 29c.

Each of the bottom dielectric layer 29a and the top dielectric layer 29c is formed of a high-k dielectric layer having a relatively low absolute value of the quadratic coefficient of VCC compared to the middle dielectric layer 29b. Preferably, each of the bottom dielectric layer 29a and the top dielectric layer 29c is formed of a material layer selected from the group consisting of $Ta_2O_5$, Ti-doped $Ta_2O_5$, Nb-doped $Ta_2O_5$, BST, PZT, and $TiO_2$ layers, and more preferably, it can be formed of a $Ta_2O_5$ layer. However, the bottom dielectric layer 29a and the top dielectric layer 29c are not necessarily formed of the same high-k dielectric layers, and can be formed of different high-k dielectric layers. However, in the case in which the bottom dielectric layer 29a and the top dielectric layer 29c are formed of the same high-k dielectric layers, the same process can be used to form the bottom dielectric layer 29a and the top dielectric layer 29c, which may be an advantage in performing the fabrication processes more conveniently. In the meantime, the bottom dielectric layer 29a and the top dielectric layer 29c are preferably formed with a thickness of 10 Å to 500 Å.

Each of the bottom dielectric layer 29a and the top dielectric layer 29c can be formed at a temperature of 200° C. to 500° C. using CVD method or ALD method. In the case of forming the bottom dielectric layer 29a and/or the top dielectric layer 29c using the ALD method, it is preferable to use a gas containing oxygen atoms as a reactant gas. The reactant gas containing oxygen atoms may be at least one gas selected from the group consisting of water vapor ($H_2O$), ozone ($O_3$), oxygen plasma ($O_2$-plasma), and nitrogen oxide plasma ($N_2O$-plasma).

In the case of forming the bottom dielectric layer 29a and/or the top dielectric layer 29c using the CVD method, the dielectric layers 29a and/or 29c are preferably formed in gas atmosphere containing oxygen atoms. The gas atmosphere containing the oxygen atoms may include at least one gas selected from the group consisting of $O_2$, $O_3$, $O_2$-plasma, and $N_2O$-plasma.

In the case of forming the dielectric layers 29a and/or 29c using the CVD method, the bottom dielectric layer 29a and/or the top dielectric layer 29c, which are formed by CVD method, can be annealed in a gas atmosphere containing oxygen atoms in order to improve the layer properties. The gas atmosphere containing oxygen atoms may include at least one gas selected from the group consisting of ozone ($O_3$), oxygen plasma ($O_2$-plasma), and nitrogen oxide plasma ($N_2O$-plasma) gas. The annealing treatment is preferably performed at a temperature range of 200° C. to 500° C.

The middle dielectric layer 29b is formed of a high-k dielectric layer having a relatively low leakage current compared to the bottom dielectric layer 29a and top dielectric layer 29c. Preferably, the middle dielectric layer 29b can be formed of a high-k dielectric layer selected from the group consisting of $Al_2O_3$, $HfO_2$, $ZrO_2$, and $La_2O_3$ layer, and more preferably, is formed of $Al_2O_3$ or $HfO_2$ layer. The middle dielectric layer 29b can be formed using CVD method or ALD method in the gas atmosphere described as above, and is preferably formed at a temperature of 200° C. to 500° C. with a thickness of 10 Å to 500 Å.

An upper electrode layer 31 is formed on the semiconductor substrate having the dielectric layers 29. The upper electrode layer 31 is formed to fill the contact hole 27a of FIG. 2B. Preferably, the upper electrode layer 31 can be formed of at least one layer selected from the group consisting of Ti, TiN, Ta, TaN, Al, Cu, W, WN, Ir, $IrO_2$, Ru, and $RuP_2$ layers, and more preferably, it is formed by sequentially stacking a TiN layer and a W layer.

The upper electrode layer 31 can be formed using CVD method or ALD method, and it is preferably formed at a temperature of 25° C. to 500° C.

Figure 2D:
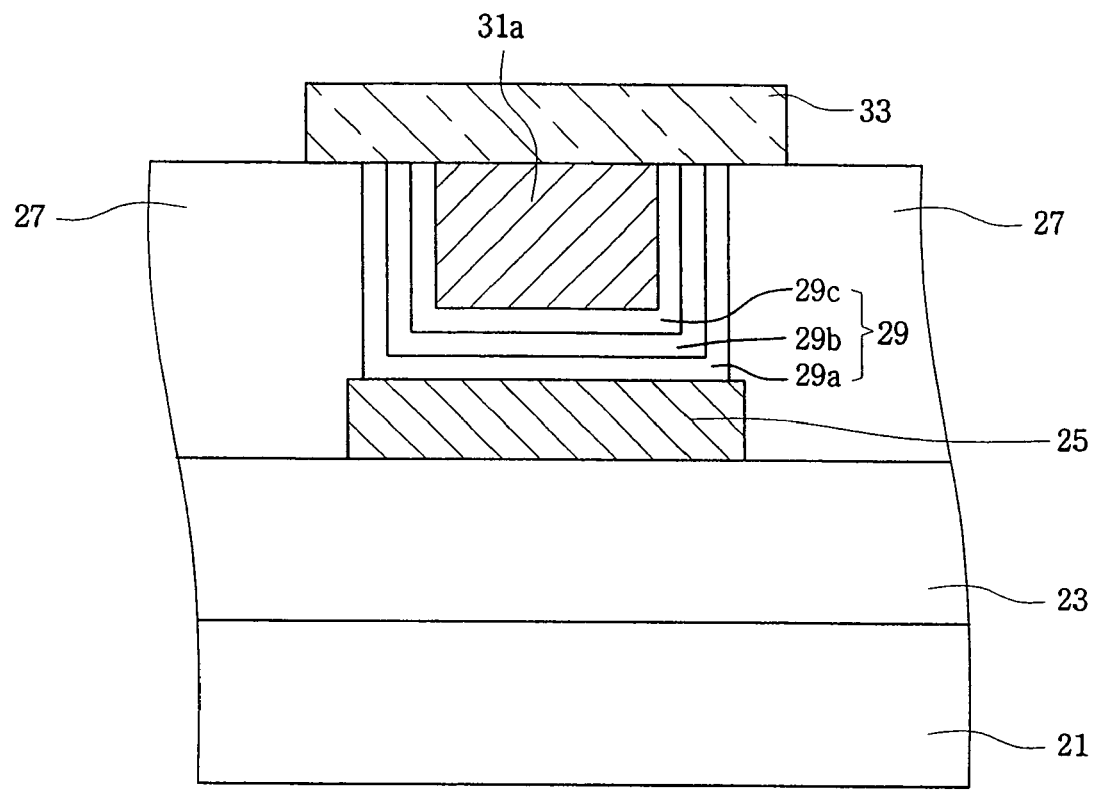

Referring to FIG. 2D, the upper electrode layer 31 and the dielectric layers 29 are planarized until the interlayer insulating layer 27 is exposed to form an upper electrode 31a inside the contact hole 27a.

A conductive layer is formed on the semiconductor substrate having the upper electrode 31a. The conductive layer is patterned using photolithography and etch processes to form an upper line 33, which is electrically connected to the upper electrode 31a.

As a result, the fabrication of a capacitor is completed, the capacitor including the lower electrode 25, the dielectric layers 29, and the upper electrode 31a described as above.

FIGS. 3A to 3D are sectional views illustrating a method of fabricating an analog capacitor according to another embodiment of the present invention.

Figure 3A:
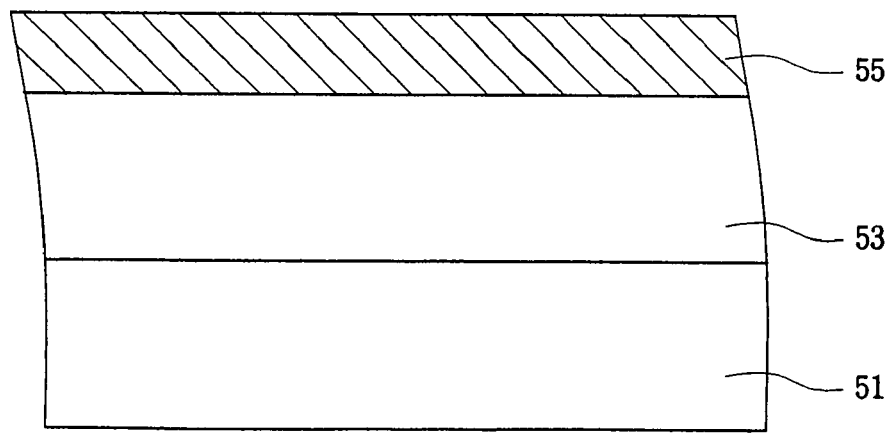
FIGS. 3A to 3D are sectional views illustrating a method of fabricating the analog capacitor of FIG. 1 according to another embodiment of the present invention.

Referring to FIG. 3A, as described in reference to FIG. 2A above, a lower insulating layer 53 and a lower electrode layer 55 are formed on the semiconductor substrate 51. However, the lower electrode layer 55 is not directly patterned.

Figure 3B:
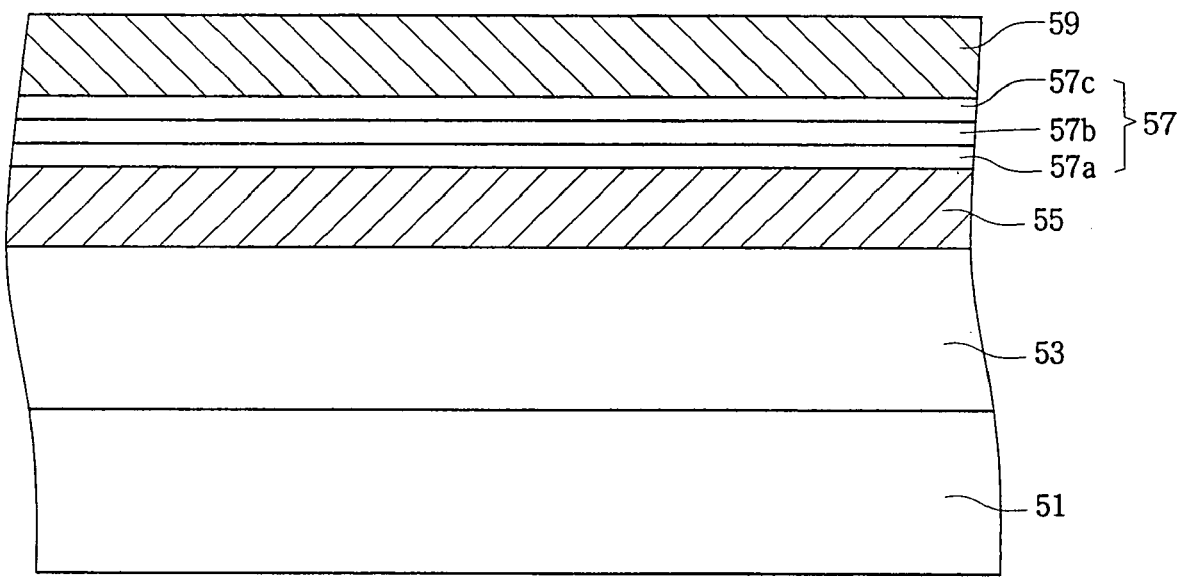

Referring to FIG. 3B, a bottom dielectric layer 57a, a middle dielectric layer 57b, and a top dielectric layer 57c are sequentially formed on the lower electrode layer 55. Before the middle dielectric layer 57b is formed, a buffer dielectric layer (not shown) can be further formed, and before the top dielectric layer 57c is formed, another buffer dielectric layer (not shown) can be further formed.

Each of the bottom dielectric layer 57a, the middle dielectric layer 57b, and the top dielectric layer 57c can be formed of the same high-k dielectric layer as illustrated in reference to FIG. 2C. Further, each of the bottom dielectric layer 57a and the top dielectric layer 57c can be formed using CVD method or ALD method as illustrated in reference to FIG. 2C.

In the case of forming the bottom dielectric layer 57a and/or the top dielectric layer 57c using CVD method, the bottom dielectric layer 57a and/or the top dielectric layer 57c can be annealed as illustrated in reference to FIG. 2C.

More dielectric layers can be formed between the bottom dielectric layer 57a and the middle dielectric layer 57b, and/or the middle dielectric layer 57b and the top dielectric layer 57c.

An upper electrode layer 59 is formed on the dielectric layers 57. The upper electrode layer 59 can be formed of the same material layer as illustrated in reference to FIG. 2C. Further, the upper electrode layer 59 can be formed using CVD method or ALD method as illustrated in reference to FIG. 2C.

Figure 3C:
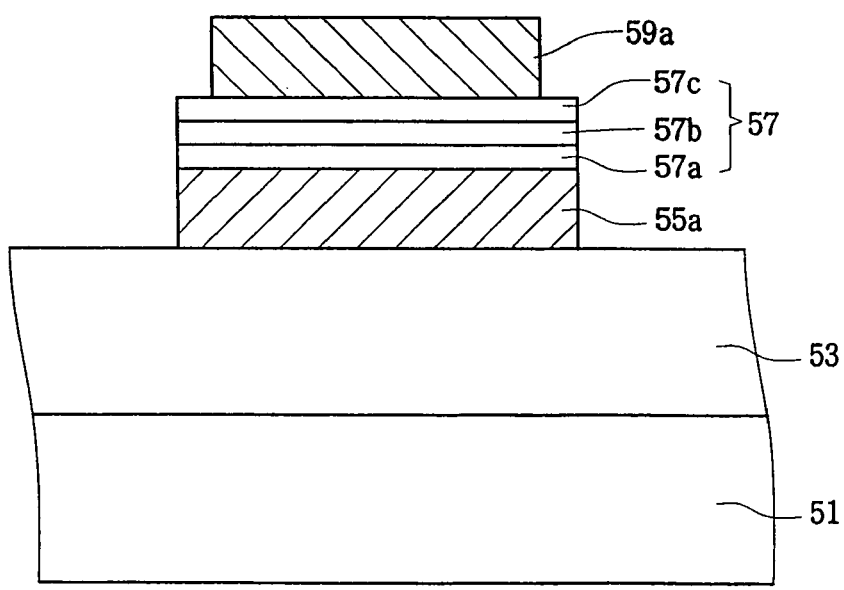

Referring to FIG. 3C, the upper electrode layer 59 is patterned using photolithography and etch processes to form an upper electrode 59a. At this time, the top surface of the dielectric layers 57 can be etched.

After the upper electrode 59a is formed, the dielectric layers 57 and the lower electrode layer 55 are patterned using photolithography and etch processes to form a lower electrode 55a. The lower electrode 55a is formed to have a greater width than the upper electrode 59a. At this time, the lower electrode layer 55 is patterned on a predetermined portion of the lower insulating layer 53 to form lower lines (not shown). The lower electrode 55a can be connected to at least one of the lower lines.

Since the upper electrode 59a and the lower electrode 55a are formed by using discrete etch processes, electrical shorts due to the etch residue, which may occur between the lower electrode 55a and the upper electrode 59a, can be prevented.

Figure 3D:
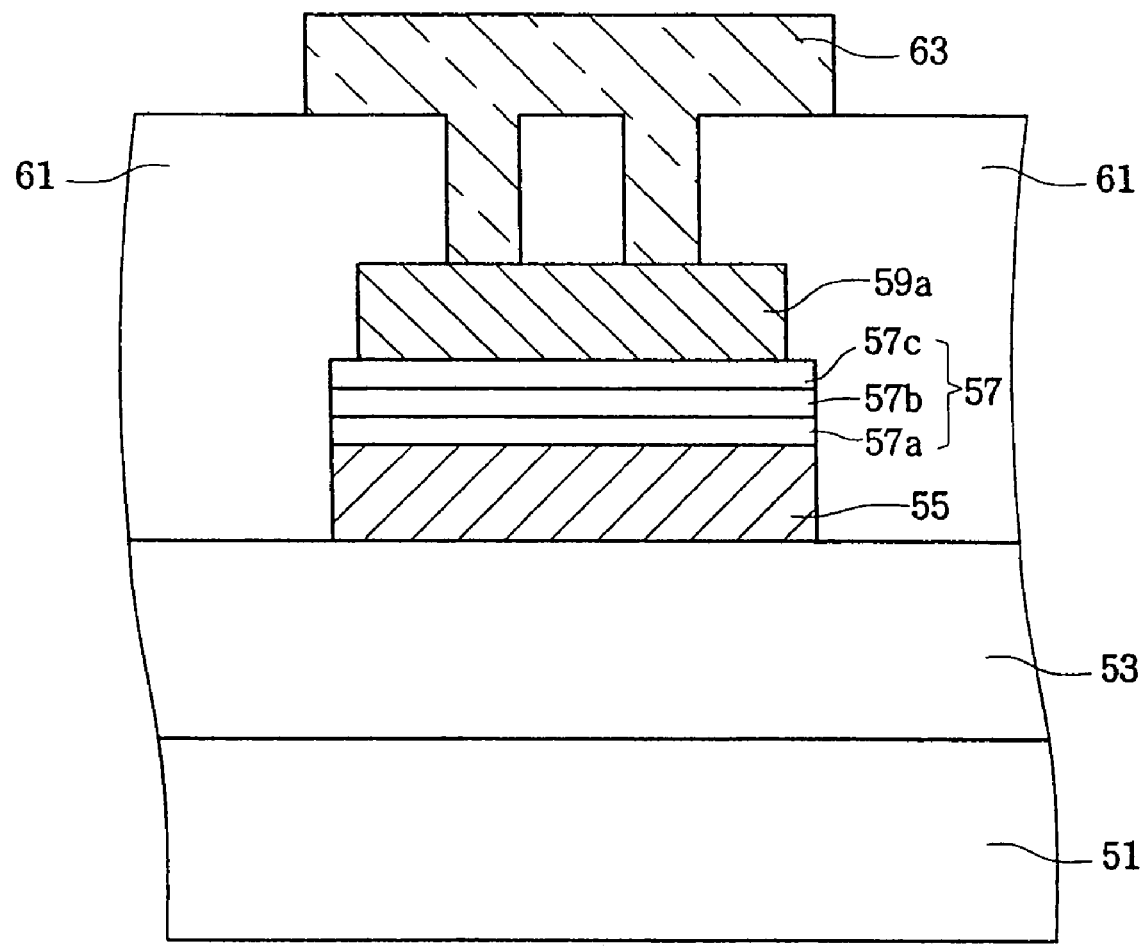

Referring to FIG. 3D, an interlayer insulating layer 61 is formed on the semiconductor substrate having the upper electrode 59a formed thereon. The interlayer insulating layer 61 can be formed of a silicon oxide layer or a low-k dielectric layer.

Then, the interlayer insulating layer 61 is patterned using photolithography and etch processes to form contact holes exposing the upper electrode 59a. Then, a conductive layer is formed on the semiconductor substrate having the contact holes, and the conductive layer is patterned to form an upper line 63 electrically connected to the upper electrode 59a.

As a result, the fabrication of a capacitor is completed, the capacitor including the lower electrode 55a, the dielectric layers 57, and the upper electrode 59a.

EXAMPLES

Now hereinafter, various measurement results for capacitors fabricated in accordance with related art, and the capacitors fabricated according to the present invention are illustrated.

Herein, each of the capacitors was fabricated in accordance with the process sequences illustrated in reference to FIGS. 2A to 2D. However, the lower electrode layer was formed by sequentially stacking Ti, TiN, Al, Ti and TiN layers, and the dielectric layers 29 of FIG. 2C were different in accordance with each capacitor, and the upper electrode layer 31 of FIG. 2C was formed by sequentially stacking TiN and W layers. Also, the leakage current of the all capacitors, which will be mentioned in the following description, was measured at a temperature of 125° C., and the capacitances were measured by applying 100 mV of AC voltage and 100 kHz of frequency.

Figure 4A:
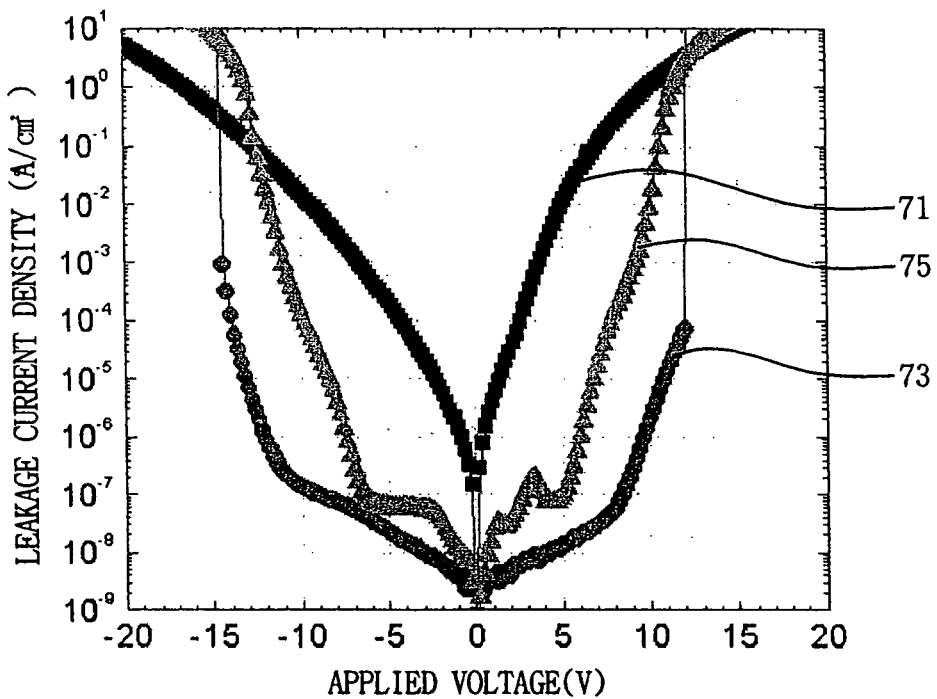
FIG. 4A is a graphical representation illustrating each of the leakage current characteristics of a capacitor having a single tantalum oxide ($Ta_2O_5$) layer, a capacitor having a single alumina ($Al_2O_3$) layer, and a capacitor having three component layers of dielectric ($Ta_2O_5$—$Al_2O_3$—$Ta_2O_5$ (TAT)) layers.
Figure 4B:
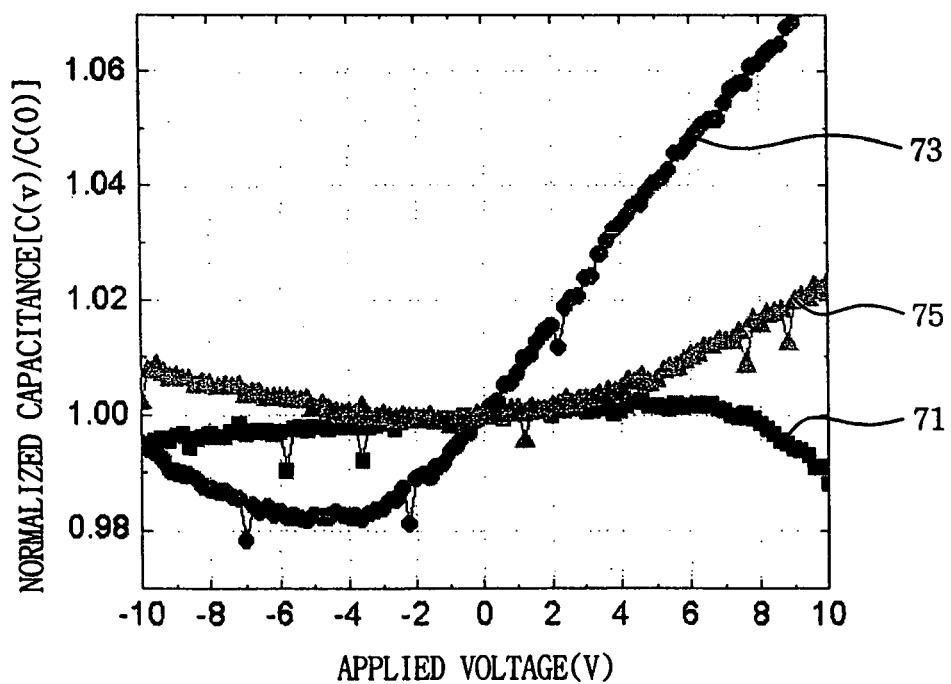
FIG. 4B is a C-V (capacitance-voltage) plot illustrating each of the VCC characteristics of the capacitors.

FIG. 4A is a graph illustrating the leakage current characteristics of a first capacitor (hereinafter, referred to as T-C) 71, the dielectric layer 29 of which was formed of a single $Ta_2O_5$ layer; a second capacitor (hereinafter, referred to as A-C) 73, the dielectric layer 29 of which was formed of a single $Al_2O_3$ layer; and a third capacitor (hereinafter, referred to as TAT-C) 75, the dielectric layers 29 of which were formed of TAT three dielectric layers, and FIG. 4B is a normalized C-V plot illustrating the VCC characteristics of each of the capacitors 71, 73, 75.

Herein, the thickness of the dielectric layers formed in the capacitors, and the equivalent oxide thickness (EOT) are represented in Table 1.

TABLE 1

| capacitor | dielectric layer | thickness(Å) | EOT(Å) |
|---|---|---|---|
| T-C 71 | $Ta_2O_5$ | 600 | 88 |
| A-C 73 | $Al_2O_3$ | 180 | 89 |
| TAT-C 75 | $Ta_2O_5$—$Al_2O_3$—$Ta_2O_5$ | 150-90-150 | 85 |

As shown in Table 1, EOTs of the capacitors 71, 73, 75 showed little difference. Further, from the data that the thickness of the $Ta_2O_5$ layer was greater than that of the $Al_2O_3$ layer to achieve the identical EOT, it could be recognized that the dielectric constant of the $Ta_2O_5$ layer was greater than that of the $Al_2O_3$ layer. In specific, the dielectric constant of the $Al_2O_3$ layer is about 9, and the dielectric constant of the $Ta_2O_5$ layer is about 30.

Referring to FIG. 4A, the leakage current density of T-C 71 was significantly higher than the leakage current density of A-C 73. When the operation voltage of an analog capacitor is ranged from −5V to 5V, the leakage current density of T-C 71 is not at an allowable magnitude in the analog capacitor. The leakage current density of A-C 73 was very low, and the leakage current density of TAT-C 75 was lower than the leakage current density of T-C 71, and higher than the leakage current density of A-C 73. However, when the operation voltage of an analog capacitor is ranged from −5V to 5V, the leakage current density of TAT-C 75 is an allowable magnitude in the analog capacitor.

Referring to FIG. 4B, the quadratic coefficient of VCC of the T-C 71 had a negative value, and its absolute value was relatively low compared to that of the A-C 73. Since the A-C 73 showed large capacitance changes depending on applied voltages V, it was not appropriate in achieving high bits in the analog capacitor.

The VCC of the TAT-C 75 had a positive quadratic coefficient value, and had a relatively high absolute value compared to that of the T-C 71. However, since the quadratic coefficient of VCC of the TAT-C 75 had a relatively low value compared to that of the A-C 73, relatively more bits could be achieved therefrom compared to the case of the A-C 73.

As a result, the VCC characteristics of the T-C 71 were good, but its leakage current characteristics were bad, and in contrast, the A-C 73 had a good leakage current characteristic but had a bad VCC characteristic. Thus, the TAT-C 75, being capable of satisfying the leakage current characteristics and the VCC characteristics, was the most appropriate analog capacitor among the capacitors.

Figure 5A:
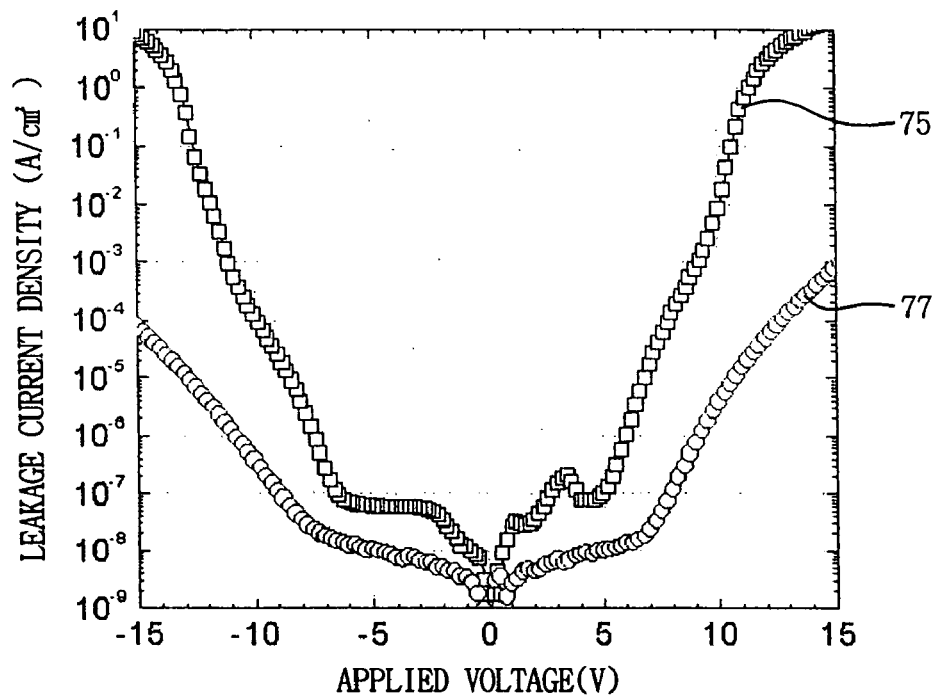
FIG. 5A is a graphical representation illustrating each of the leakage current characteristics of a capacitor having three component layers of dielectric ($Al_2O_3$—$Ta_2O_5$—$Al_2O_3$ (ATA)) layers, and a capacitor having three component layers of TAT dielectric layers.
Figure 5B:
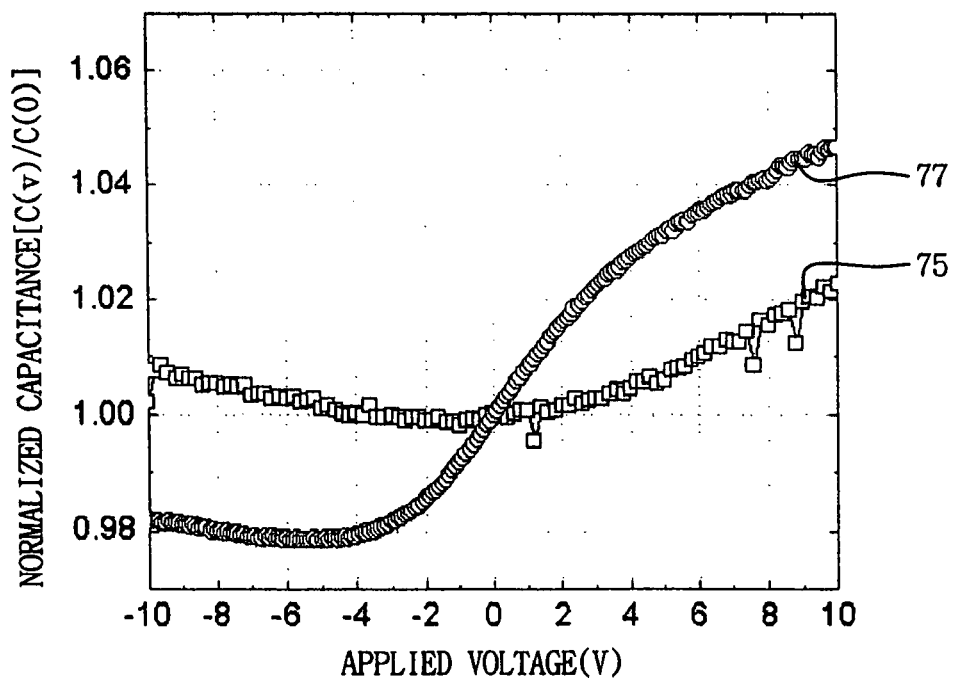
FIG. 5B is a C-V plot illustrating each of the VCC characteristics of the capacitor having three component layers of ATA dielectric layers and the capacitor having three component layers of TAT dielectric layers.

FIG. 5A is a graphical representation illustrating each of the leakage current characteristics of the TAT-C 75, and a capacitor (hereinafter ATA-C) 77 having three component layers $Al_2O_3$—$Ta_2O_5$—$Al_2O_3$ (ATA), and FIG. 5B is a normalized C-V plot illustrating each of the VCC characteristics of the capacitors 75, 77.

Herein, the thickness of the dielectric layers formed on the capacitors and the equivalent oxide thickness are represented in Table 2.

TABLE 2

| capacitor | dielectric layers | thickness(Å) | EOT(Å) |
|---|---|---|---|
| TAT-C 75 | $Ta_2O_5$—$Al_2O_3$—$Ta_2O_5$ | 150-90-150 | 85 |
| ATA-C 77 | $Al_2O_3$—$Ta_2O_5$—$Al_2O_3$ | 50-400-50 | 115 |

As shown in Table 2, the EOT of the TAT-C 75 was lower than that of the ATA-C 77. This was because the total thickness of the $Ta_2O_5$ and the $Al_2O_3$ layers of the ATA-C 77 was greater than that of the $Ta_2O_5$ and the $Al_2O_3$ layers of the TAT-C 75.

Referring to FIG. 5A, the leakage current density of the ATA-C 77 was lower than that of the TAT-C 75. This is related with the work function difference between the electrode and the dielectric layer being in contact with that. That is, if the work function difference between the electrode and the dielectric layer contacting the electrode is high, the leakage current is decreased. However, the leakage current density of the TAT-C 75 is an allowable magnitude in an analog capacitor. Therefore, it is not necessary to form the $Al_2O_3$ layer to directly contact the electrode in order to prevent the leakage current.

Referring to FIG. 5B, the change of the capacitance in accordance with the applied voltage (V) of the TAT-C 75 was lower than that of the ATA-C 77. In specific, the C-V curve of the ATA-C 77 was similar to the C-V curve of the A-C 73 of FIG. 4B. Further, if the $Al_2O_3$ and the $Ta_2O_5$ layers had been formed with the lower thickness than the above, in order to make the EOT of the ATA-C 77 identical to that of the TAT-C 75, the VCC characteristics would have been worse.

From the above result, it is recognized that the VCC characteristics of the capacitor can be optimized when the dielectric layers having good VCC characteristics are made to contact the electrodes, and it is not necessary to form the dielectric layers having good leakage current characteristics to contact the electrodes.

Figure 6A:
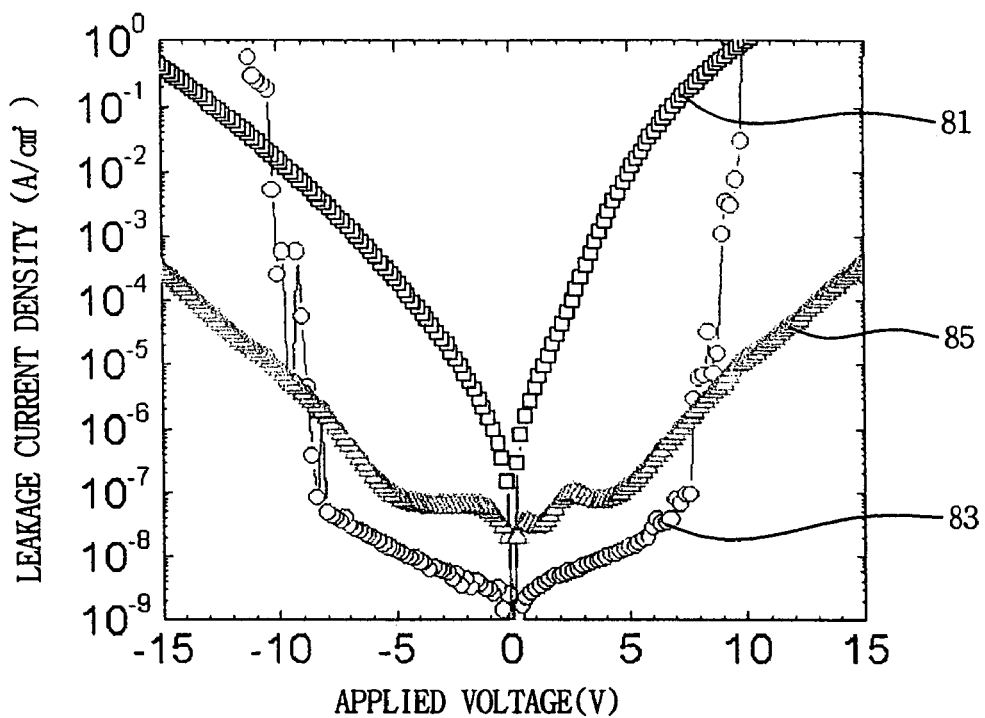
FIG. 6A is a graphical representation illustrating each of the leakage current characteristics of a capacitor having a single tantalum oxide ($Ta_2O_5$) layer, a capacitor having a single hafnium oxide ($HfO_2$) layer, and a capacitor having three component layers of dielectric ($Ta_2O_5$—$HfO_2$—$Ta_2O_5$ (THT)) layers.
Figure 6B:
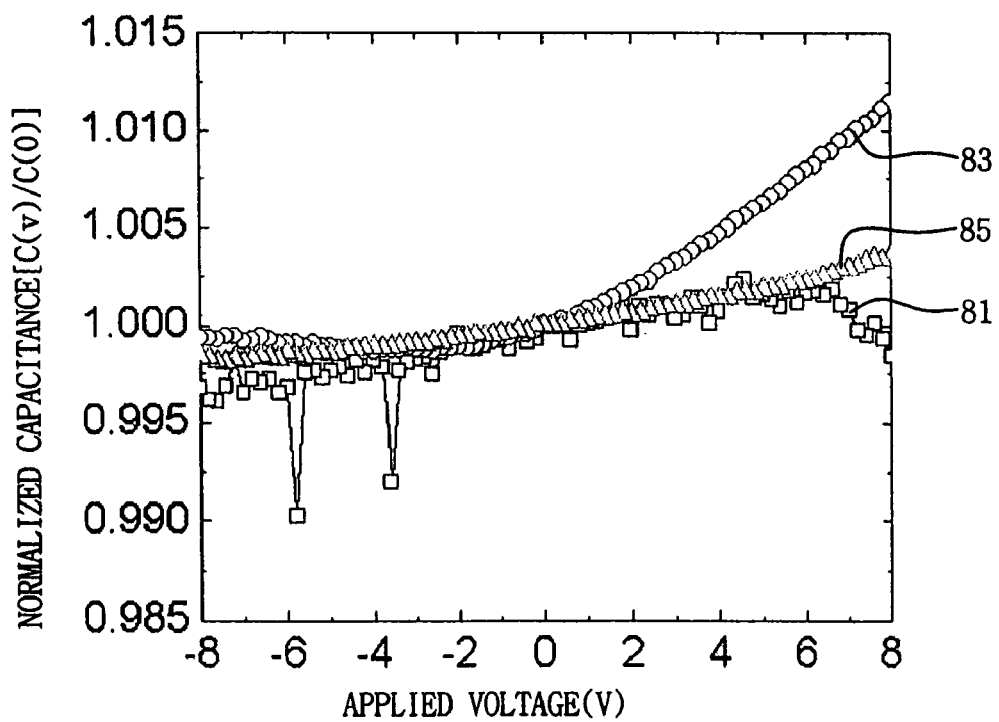
FIG. 6B is a C-V plot illustrating each of the VCC characteristics of the capacitors.

FIG. 6A is a graphical representation illustrating each of the leakage current characteristics of a capacitor T-C 81 having a single $Ta_2O_5$ layer as the dielectric layer 29 of FIG. 2C, a capacitor (hereinafter, referred to as H-C) 83 having a single $HfO_2$ layer as the dielectric layer 29, and a capacitor (hereinafter, referred to as THT-C) 85 having three component $Ta_2O_5$—$HfO_2$—$Ta_2O_5$ (THT) layers as the dielectric layer 29, and FIG. 6B is a normalized C-V plot illustrating each of the VCC characteristics of the capacitors 81, 83, 85.

Herein, the thickness of the dielectric layers formed on the capacitors, and the equivalent oxide thickness are represented in Table 3.

TABLE 3

| capacitor | dielectric layer(s) | thickness(Å) | EOT(Å) |
|---|---|---|---|
| T-C 81 | $Ta_2O_5$ | 600 | 88 |
| H-C 83 | $HfO_2$ | 420 | 85 |
| THT-C 85 | $Ta_2O_5$—$HfO_2$—$Ta_2O_5$ | 200-150-200 | 85 |

As shown in Table 3, the EOTs of the capacitors 81, 83, 85 showed little difference. Further, from the fact that the thickness of the $Ta_2O_5$ layer was greater than that of the $HfO_2$ layer to achieve the identical EOT, it could be recognized that the dielectric constant of the $Ta_2O_5$ layer was greater than that of the $HfO_2$ layer. In specific, the dielectric constant of the $HfO_2$ layer is about 20, and lower than the dielectric constant of the $Ta_2O_5$ layer.

Referring to FIG. 6A, the leakage current density of the T-C 81 was significantly higher increased than that of the H-C 83. As described above in reference to FIG. 4A, the T-C 81 was not appropriate for an analog capacitor. The leakage current density of the H-C 83 had a significantly low value. However, since the H-C 83 had a low breakdown voltage (BV), it was not appropriate for an analog capacitor either.

In contrast, the leakage current density of the THT-C 85 was relatively low compared to that of the T-C 81, and the breakdown voltage (BV) thereof was significantly high compared to that of the H-C 83.

Referring to FIG. 6B, as described above in reference to FIG. 4B, the absolute value of the quadratic coefficient of VCC of the T-C 81 was relatively low compared to those of other capacitors. The capacitance change of the H-C 83 in accordance with the applied voltage V was significantly great. The absolute value of the quadratic coefficient of VCC of the THT-C 85 was relatively low compared to that of the H-C 83.

As a result, the THT-C 85 could satisfy all of the leakage current characteristics, the BV characteristics, and the VCC characteristics.

Figure 7A:
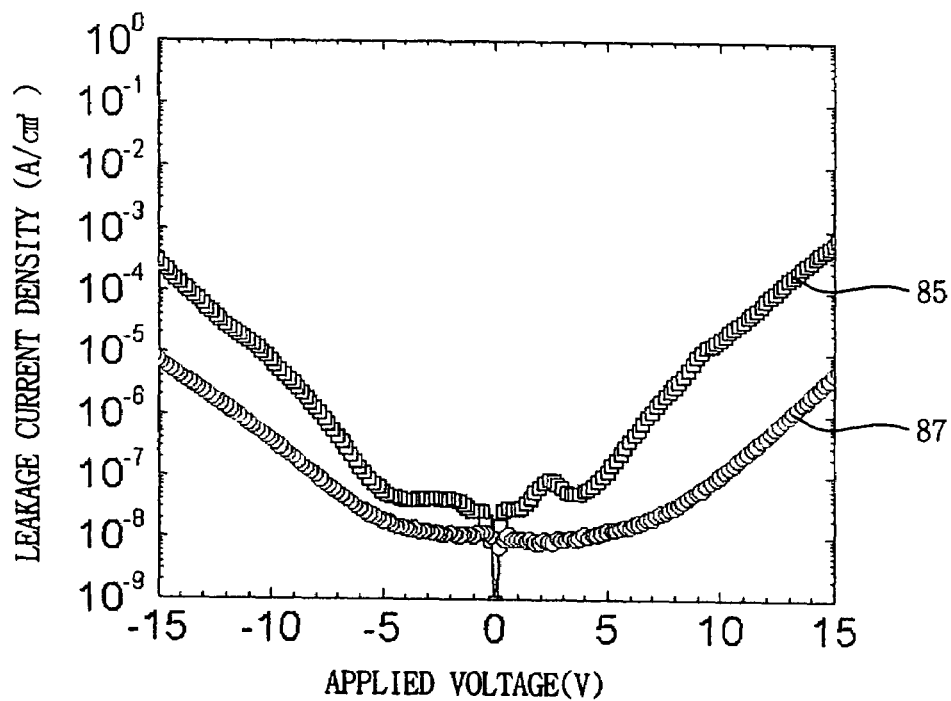
FIG. 7A is a graphical representation illustrating each of the leakage current characteristics of a capacitor having three component layers of dielectric ($HfO_2$—$Ta_2O_5$—$HfO_2$ (HTH)) layers, and a capacitor having three component layers of TAT dielectric layers.
Figure 7B:
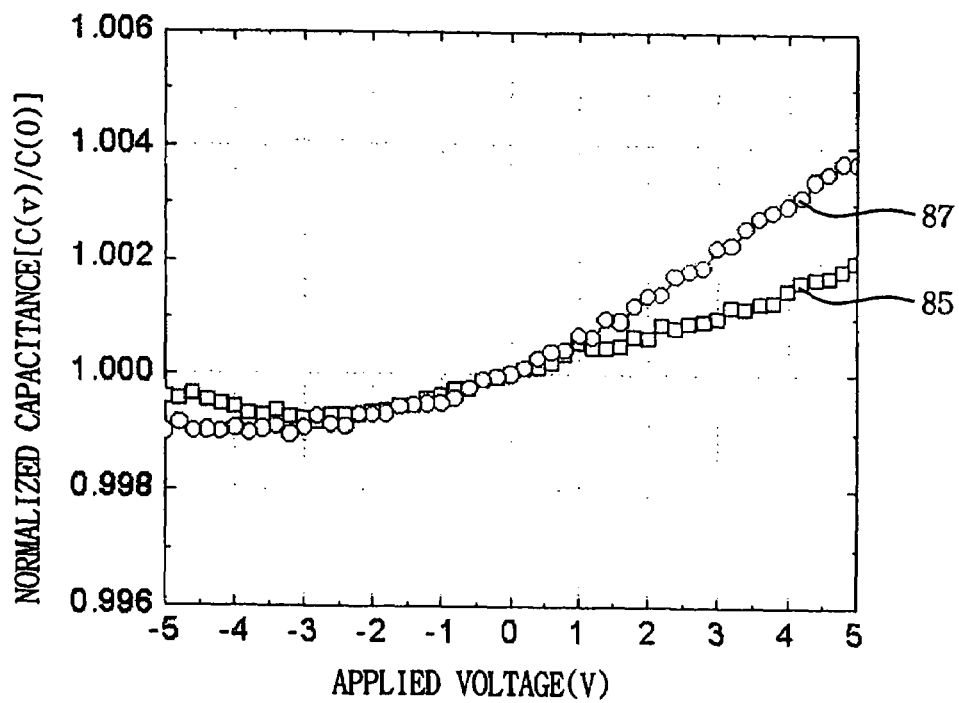
FIG. 7B is a C-V plot illustrating each of the VCC characteristics of the capacitor having three component layers of HTH dielectric layers and the capacitor having three component layers of TAT dielectric layers.

FIG. 7A is a graphical representation illustrating each of the leakage current characteristics of the capacitor THT-C 85, and a capacitor (hereinafter, referred to as HTH-C) 87 having three component layers $HfO_2$—$Ta_2O_5$—$HfO_2$ (HTH) as its dielectric layer 29 of FIG. 2C, and FIG. 7B is a normalized C-V plot illustrating each of the VCC characteristics of the capacitors 85, 87.

Herein, the thickness of the dielectric layers formed on the capacitors and the equivalent oxide thickness are represented in Table 4.

TABLE 4

| capacitor | dielectric layers | thickness(Å) | EOT(Å) |
|---|---|---|---|
| THT-C 85 | $Ta_2O_5$—$HfO_2$—$Ta_2O_5$ | 200-150-200 | 85 |
| HTH-C 87 | $HfO_2$—$Ta_2O_5$—$HfO_2$ | 75-400-75 | 85 |

As shown in Table 4, the EOTs of the THT-C 85, and the HTH-C 87 showed no difference.

Referring to FIG. 7A, the leakage current density of the HTH-C 87 was lower than that of the THT-C 85. This can be understood as illustrated in reference to FIG. 5A. Further, since the leakage current density of the THT-C 85 is also allowable in an analog capacitor, it is not necessary to form the $HfO_2$ layer to contact the electrode.

Referring to FIG. 7B, for the capacitance change in accordance with the applied voltage V, the capacitance change of the THT-C 85 was smaller than that of the HTH-C 87. Specifically, it could be recognized that the C-V curve of the HTH-C 87 was similar to that of the C-V curve of the H-C 83 of FIG. 6B. This is understood that the interface between the electrode and the dielectric layer contacting the electrode affects the VCC characteristics.

As a result, when the dielectric layers having good VCC characteristics are formed to contact the electrodes, the VCC characteristics of the capacitor can be optimized. Further, in order to prevent the leakage current, it is necessary to use a dielectric layer having good leakage current characteristics, but even though a dielectric layer having good leakage current characteristics does not directly contact the electrodes, the leakage current can be significantly decreased.

According to the present invention, in an analog capacitor with a use of a high-k dielectric layer, its VCC characteristics and leakage current characteristics being optimized, can be provided.

While the present invention has been particularly shown and described with reference to exemplary embodiments thereof, it will be understood by those skilled in the art that various changes in form and details may be made therein without departing from the spirit and scope of the present invention as defined by the following claims.

What is claimed is:

1. A method of fabricating an analog capacitor comprising:
   a) forming a lower insulating layer on a semiconductor substrate;
   b) forming a lower electrode layer on the lower insulating layer, wherein the lower electrode layer comprises a conductive layer, wherein the conductive layer comprises a material selected from the group consisting of titanium (Ti), titanium nitride (TiN), tantalum (Ta), tantalum nitride (TaN), aluminum (Al), copper (Cu), tungsten (W), tungsten nitride (WN), iridium (Ir), iridium oxide ($IrO_2$), ruthenium (Ru), and ruthenium oxide ($RuO_2$);
   c) sequentially forming at least three high-k dielectric layers on the semiconductor substrate having the lower electrode layer, the at least three high-k dielectric layers comprising a bottom dielectric layer that contacts the conductive layer of the lower electrode layer, a middle dielectric layer, and a top dielectric layer, wherein each of the bottom dielectric layer and the top dielectric layer is a high-k dielectric layer having a relatively low absolute value of a quadratic coefficient of VCC compared to that of the middle dielectric layer, and the middle dielectric layer is a high-k dielectric layer having a relatively low leakage current compared to those of the bottom dielectric layer and the top dielectric layer, wherein the bottom dielectric layer contacting the conductive layer of the lower electrode layer comprises a material selected from the group consisting of $Ta_2O_5$, Ti-doped $Ta_2O_5$, Nb-doped $Ta_2O_5$, BST, PZT and $TiO_2$, and wherein the middle dielectric layer comprises a material selected from the group consisting of $HfO_2$, $ZrO_2$, and $La_2O_3$; and
   d) forming an upper electrode layer on the at least three high-k dielectric layers to be in contact with the top dielectric layer.

2. The method according to claim 1, wherein the top dielectric layer are formed of a different material layer from the bottom dielectric layer.

3. The method according to claim 2, wherein the top dielectric layer is a material layer selected from the group consisting of $Ta_2O_5$, Ti-doped $Ta_2O_5$, Nb-doped $Ta_2O_5$, BST, PZT and $TiO_2$ layers.

4. The method according to claim 3, further comprising:
   forming a buffer dielectric layer prior to formation of the middle dielectric layer; and
   forming another buffer dielectric layer prior to formation of the top dielectric layer.

5. The method according to claim 4, wherein each of the bottom dielectric layer, the middle dielectric layer, and the top dielectric layer is formed using CVD method or ALD method.

6. The method according to claim 5, wherein each of the dielectric layers formed using CVD method or ALD method, is formed at a temperature range of 200° C. to 500° C.

7. The method according to claim 5, further comprising:
   annealing the dielectric layers formed using the CVD method in a gas atmosphere containing oxygen.

8. The method according to claim 7, wherein the gas atmosphere containing oxygen is an atmosphere containing at least one gas selected from the group consisting of $O_3$, $O_2$-plasma and $N_2O$-plasma gases.

9. The method according to claim 2, wherein one dielectric layer of the bottom dielectric layer and the top dielectric layer is a $Ta_2O_5$ layer.

10. The method according to claim 9, wherein the other dielectric layer of the bottom dielectric layer and the top dielectric layer is a high-k dielectric layer selected from the group consisting of BST, PZT and $TiO_2$ layers.

11. The method according to claim 10, further comprising:
forming a buffer dielectric layer prior to formation of the middle dielectric layer; and
forming another buffer dielectric layer prior to formation of the top dielectric layer.

12. The method according to claim 11, wherein each of the bottom dielectric layer, the middle dielectric layer, and the top dielectric layer is formed using CVD method or ALD method.

13. The method according to claim 12, wherein each of the dielectric layers formed using CVD method or ALD method, is formed at a temperature range of 200° C. to 500° C.

14. The method according to claim 1, wherein the top dielectric layer is formed of a same material layer as the bottom dielectric layer.

15. The method according to claim 14, wherein the same material layer is a $Ta_2O_5$ layer.

16. The method according to claim 15, further comprising:
forming a buffer dielectric layer prior to formation of the middle dielectric layer; and
forming another buffer dielectric layer prior to formation of the top dielectric layer.

17. The method according to claim 16, wherein each of the bottom dielectric layer, the middle dielectric layer, and the top dielectric layer is formed using CVD method or ALD method.

18. The method according to claim 17, further comprising:
annealing the dielectric layers formed by the CVD method in a gas atmosphere containing oxygen.

* * * * *